United States Patent
Haseeb et al.

(10) Patent No.: US 12,424,990 B2
(45) Date of Patent: Sep. 23, 2025

(54) OP-AMP WITH RANDOM OFFSET TRIM ACROSS INPUT RANGE WITH RAIL-TO-RAIL INPUT

(71) Applicant: Microchip Technology Incorporated, Chandler, AZ (US)

(72) Inventors: Abdul Haseeb, Karnataka (IN); Supreet Bhanja Deo, Bangalore (IN); Raghuveer Murukumpet, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 577 days.

(21) Appl. No.: 17/858,685

(22) Filed: Jul. 6, 2022

(65) Prior Publication Data
US 2023/0032759 A1     Feb. 2, 2023

(30) Foreign Application Priority Data
Jul. 27, 2021   (IN) .............................. 202111033687

(51) Int. Cl.
*H03F 3/45*       (2006.01)

(52) U.S. Cl.
CPC ..... *H03F 3/45475* (2013.01); *H03F 3/45183* (2013.01); *H03F 2200/375* (2013.01); *H03F 2203/45138* (2013.01)

(58) Field of Classification Search
CPC ............. H03F 3/45475; H03F 3/45183; H03F 2200/375; H03F 2200/453; H03F 2200/456; H03F 2203/45138; H03F 2203/45038; H03F 2203/45678; H03F 2203/45681; H03F 2203/45624
USPC ..................................... 330/254, 255, 253, 9
See application file for complete search history.

(56) References Cited

U.S. PATENT DOCUMENTS

| 6,194,962 B1 | 2/2001 | Chen ................................ 330/9 |
| 6,696,894 B1 | 2/2004 | Huang .......................... 330/253 |
| 2017/0155386 A1* | 6/2017 | Yuan .................... H03K 17/687 |

OTHER PUBLICATIONS

International Search Report and Written Opinion, Application No. PCT/US2022/037963, 14 pages, Nov. 15, 2022.

* cited by examiner

*Primary Examiner* — Andrea Lindgren Baltzell
*Assistant Examiner* — Nareh Shamiryan
(74) *Attorney, Agent, or Firm* — SLAYDEN GRUBERT BEARD PLLC (57) ABSTRACT

An operational amplifier includes a pre-amplifier circuit, a first trim circuit, and a second trim circuit. The pre-amplifier circuit is to include a differential pair and receive an input voltage. The first trim circuit is to produce an offset voltage correction current and provide the offset voltage correction current to the pre-amplifier circuit to correct an offset of the operational amplifier. The second trim circuit is to produce a common mode voltage (VCM) correction current, provide the VCM voltage correction current to the pre-amplifier circuit, and cause the VCM correction current to have a non-zero value to reduce a correction caused by the offset voltage correction current when the input voltage is within a mid voltage input range. The pre-amplifier circuit is to apply the offset correction current and the VCM correction current to output signals of the differential pair.

20 Claims, 7 Drawing Sheets

OP-AMP WITH RANDOM OFFSET TRIM ACROSS INPUT RANGE WITH RAIL-TO-RAIL INPUT

PRIORITY

This application claims priority to Indian Application No. 202111033687 filed Jul. 27, 2021, the contents of which are hereby incorporated in their entirety.

TECHNICAL FIELD

The present disclosure relates to electronics and operational amplifiers and, more particularly, to trimming random offset across input range for rail-to-rail input class ab op-amp.

BACKGROUND

Operational amplifiers, or op-amps, may be implemented with input differential pairs of transistors. The input pairs of transistors may be implemented respectively by a pair of n-channel metal-oxide semiconductor (NMOS) transistors and a pair of p-channel metal-oxide semiconductor (PMOS) transistors. A rail-to-rail op-amp may refer to an op-amp that is to operate within a +/−Vs input voltage range. Op-amps may include an internal structure with the two transistor pairs. In operation, the op-amp may switch from using one of the transistor pairs to the other of the transistor pairs as the input voltage changes. Each of the input transistor pairs may have independent offset voltages on the input thereon. The PMOS pair and the NMOS pair may have intrinsically different input offset voltages, and thus the two offset voltages often do not match. Inventors of examples of the present disclosure have thus discovered that, when the differential pairs are switching operation, the overall offset may vary due to such switching. In particular, inventors of examples of the present disclosure have discovered that a common-mode offset, when both the NMOS pair and the PMOS pair are active, may be unpredictable and out of range and variable compared to the offset when only one such pair is active. This common-mode offset may cause distortion and incorrect op-amp output. Moreover, inventors of examples of the present disclosure have discovered that existing op-amps may provide low offset values when input voltages are high and low, such as when only one of the NMOS or PMOS pairs are active, but not when input voltages are within a more middle range such as when both of the NMOS and PMOS pairs are active. Inventors of examples of the present disclosure have discovered such examples that may address one or more of these identified problems.

A more complete understanding of the present disclosure may be acquired by referring to the following description taken in conjunction with the accompanying drawings.

While the present disclosure is susceptible to various modifications and alternative forms, specific examples thereof have been shown in the drawings and are herein described in detail. It should be understood, however, that the description herein of specific examples is not intended to limit the disclosure to the forms disclosed herein.

DETAILED DESCRIPTION

Figure 1:
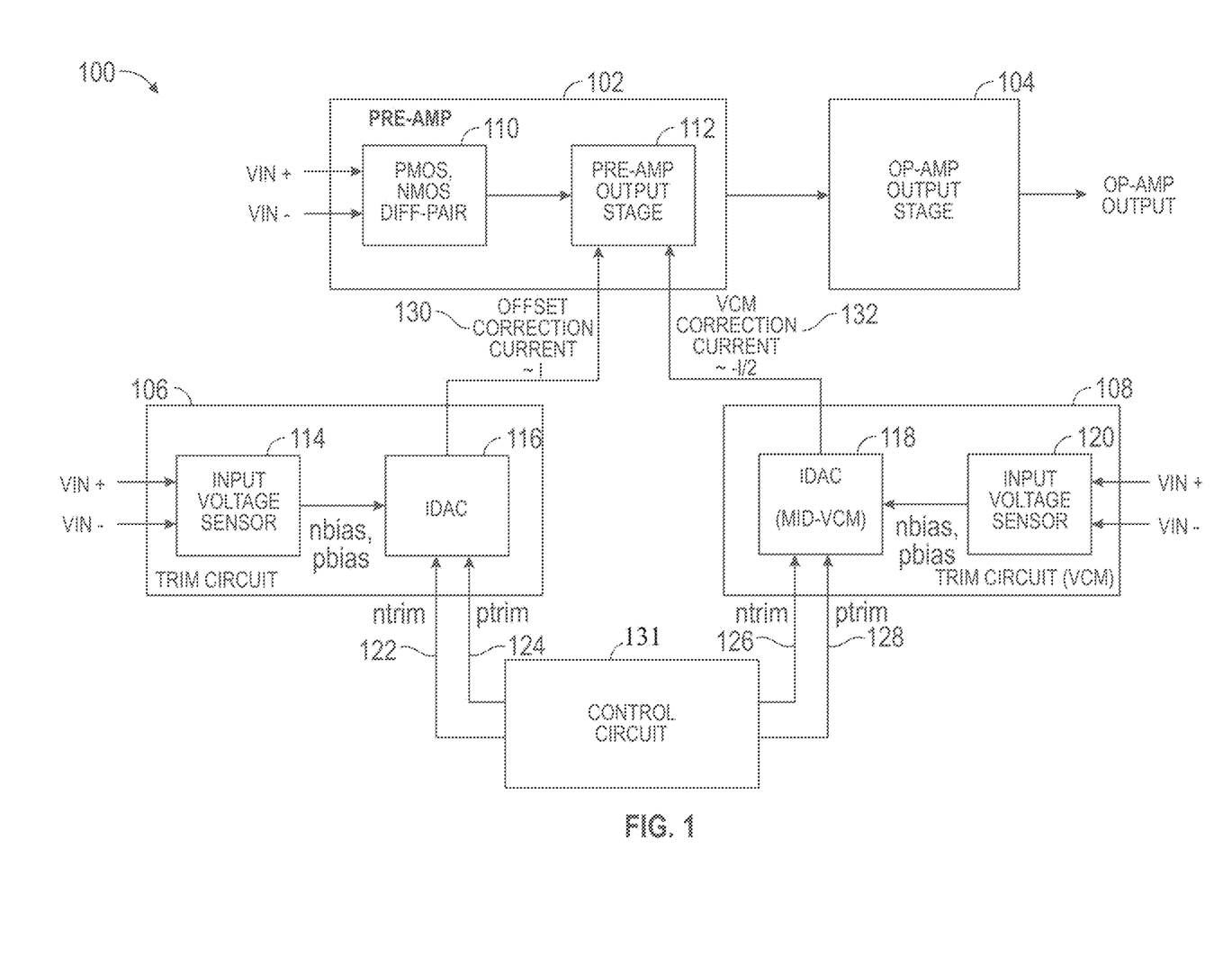
FIG. 1 is an illustration of block diagram of an op-amp, according to examples of the present disclosure.

FIG. 1 is an illustration of block diagram of an op-amp 100, according to examples of the present disclosure.

Op-amp 100 may include a pre-amplifier 102, op-amp output stage 104, trim circuits 106, 108, and control circuit 131. Pre-amplifier 102 may be configured to receive a differential voltage input, given by VIN+ and VIN−. Pre-amplifier 102 may be configured to provide a significant portion of the voltage gain of op-amp 100 and establish the internal resistance of op-amp 100. Moreover, pre-amplifier 102 may be configured to receive correction currents 130, 132, as discussed in more detail below. In addition, example implementations of pre-amplifier 102 are shown below. Pre-amplifier 102 may be configured to provide the bulk of the amplification of op-amp 100 to output stage 104. Op-amp output stage 104 may be configured to provide a current drive to an external load, as well as any other signal conditioning or additional amplification on behalf of op-amp 100.

Pre-amplifier 102 may be implemented by an PMOS and NMOS differential pair of transistors 110, referred to as differential pair 110. Differential pair 110 may be implemented by a pair of NMOS transistors whose drains are connected together to a voltage supply, whose sources are connected together to output of the differential pair 110, and whose gates are respectively connected to the VIN+ and VIN− inputs. A current source may be implemented between the voltage supply and the drains of the NMOS pair of differential pair 110. Differential pair 110 may also be implemented by a pair of PMOS transistors whose drains are connected together to a ground, whose sources are connected together to output of the differential pair 110, and whose gates are respectively connected to the VIN+ and VIN-inputs. A current sink may be implemented between the drains of the PMOS pair of differential pair 110 and the ground.

The input range of op-amp 100 may be a rail-to-rail input voltage range of a given voltage of [AVDD-Vo, −Vo], wherein AVDD is an analog VDD of the system of op-amp 100 and Vo is a nominal voltage value to define the range. In one example, Vo may be 0.4 V.

Pre-amplifier output stage 112 may be implemented as a folded-cascode pre-driver. Pre-amplifier output stage 112 may include an integrated floating voltage source. Pre-amplifier output stage 112 may be configured to compensate or adjust signals from differential pair 110 before such signals are provided to op-amp output stage 104. Pre-amplifier output stage 112 may provide a requisite bias voltage to a driver such as op-amp output stage 104. Pre-amplifier output stage 112 may be configured to compensate or adjust such signals according to determinations provided by, for example, trim circuits 106, 108, or any combination thereof. Such determinations may be indicated by any suitable signals from trim circuits 106, 108, such as correction currents. The correction currents may include, for example, offset correction current 130 from trim circuit and common-mode voltage (VCM) correction current 132. In one example, the current value of offset correction current 130 may be approximately twice the magnitude of the current value of VCM correction current 132. In another example, the current value of offset correction current 130 may be an opposite polarity of the current value of VCM correction current 132.

Pre-amplifier output stage 112 may receive a push current from the PMOS transistor pair of differential pair 110. Moreover, pre-amplifier output stage 112 may receive a pull current from the NMOS transistor pair of differential pair 110. These push and pull currents may reflect the voltage input received at op-amp 100.

Op-amp 100 may include trim circuits 106, 108. Trim circuit 106 and trim circuit 108 may be configured to respectively generate correction currents 130, 132 whereby output of differential pair 110 may be adjusted by output stage 112 to adjust for offset voltage and common mode voltage. Trim circuit 106 may be configured to generate correction current 130 to adjust for offset voltage in op-amp 100. Trim circuit 108 may be configured to generate VCM correction current 132 to adjust for common mode voltages that may occur when, for example, both NMOS and PMOS pairs of transistors are active in differential pair 110 of pre-amplifier 102. In one example, trim circuit 108 may be configured to provide a non-zero VCM correction current 132 only when both the NMOS pair of transistors and the PMOS pair of transistors of differential pair 110 are both active, wherein when both pairs of differential pair 110 are both active differential pair 110 may generate common mode voltages on the inputs of op-amp 100. Trim circuits 106, 108 may each include a digital to analog converter (DAC), current source, analog circuitry, digital circuitry, any suitable combination thereof, or any other suitable mechanism for generating a current to be used as correction currents 130, 132. Such a source of correction currents 130, 132 may be referred to as a current source circuit, and may be implemented by, for example, IDACs 116, 118.

Moreover, such a current source circuit such as IDACs 116, 118 may be programmable or adjustable. Thus, trim circuits 106, 108 may be configured to receive any suitable designation of the amount of current that is to be generated therein by the current source circuits. For example, trim circuit 106 may be configured to receive ntrim bits 122 and ptrim bits 124. Trim circuit 108 may be configured to receive ntrim bits 126, ptrim bits 128. In some examples, ntrim bits 122, 126 may be the same, and ptrim bits 124, 128 may be the same. Trim bits 122, 124, 126, 128 may be generated or stored in any suitable manner. For example, trim bits 122, 124, 126, 128 may each be four bits long and generated or provided by a control circuit 131. Control circuit 131 may be implemented by analog circuitry, digital circuitry, control logic, memory, instructions for execution by a processor, or any suitable combination thereof. In some examples, control circuit 131 might not be present in op-amp 100 and may be external to op-amp 100, and simply provide trim bits 122, 124, 126, 128 to trim circuits 106, 108. Moreover, control circuit 131 may be implemented simply as a memory location such as a register or fuse to provide trim bits 122, 124, 126, 128 to trim circuits 106, 108.

The values of correction currents 130 may be specified by trim bits 122, 124, 126, 128 according to a degree of offset and VCM voltages. The degree of offset and VCM voltages may be specific to the input transistors of differential pair 110. Thus, trim bits 122, 124, 126, 128 may be characterized for a given op-amp 100 or differential pair 110. Accordingly, trim bits 122, 124, 126, 128 may be determined by a characterization of differential pair 110. The characterization may be performed in any manner and at any time. The characterization may be performed by any suitable entity, such as control circuit 131, a validation, test, or manufacturing device for the production of op-amp 100, by test equipment or users of op-amp 100 when op-amp 100 is deployed, or by self-diagnostics of a system in which op-amp 100 is included or used, such as microcontroller. The characterization may be stored permanently or in a transitory manner.

In one example, trim bits 122, 126 may be used to trim output of the NMOS transistor pair of differential pair 110 of pre-amplifier 102. In another example, trim bits 124, 128 may be used to trim output of the PMOS transistor pair of differential pair 110 of pre-amplifier 102.

The characterization of pre-amplifier 102 may be performed by evaluating offset at voltages from the lowest end, middle, and highest end of the voltage input ranges for op-amp 100. For example, a low offset may be measured at a lowest end of voltage input of 0.4 V. For such low input, only the PMOS transistor pair of differential pair 110 of pre-amplifier 102 may be active. Thus, ptrim bits 124 may be set so as to cause IDAC 116 of trim circuit 106 to generate a current value of offset correction current 130 for pre-amp output stage 112 to nullify this low offset. Similarly, a high offset may be measured at a highest end of voltage input of AVDD-0.4V. For such a high input, only the NMOS transistor pair of differential pair 110 of pre-amplifier 102 may be active. Thus, ntrim bits 122 may be set so as to cause IDAC 116 of trim circuit 106 to generate a current value of offset correction current 130 for pre-amp output stage 112 to nullify this high offset.

Further, a middle offset can be measured at a middle range of voltage input. This may correspond to a voltage point at which VCM may be generated on the inputs of op-amp 100. However, as discussed below, this middle offset may not be minimized given the characterized trim bits 122, 124 as applied to trim circuit 106.

Figure 2:
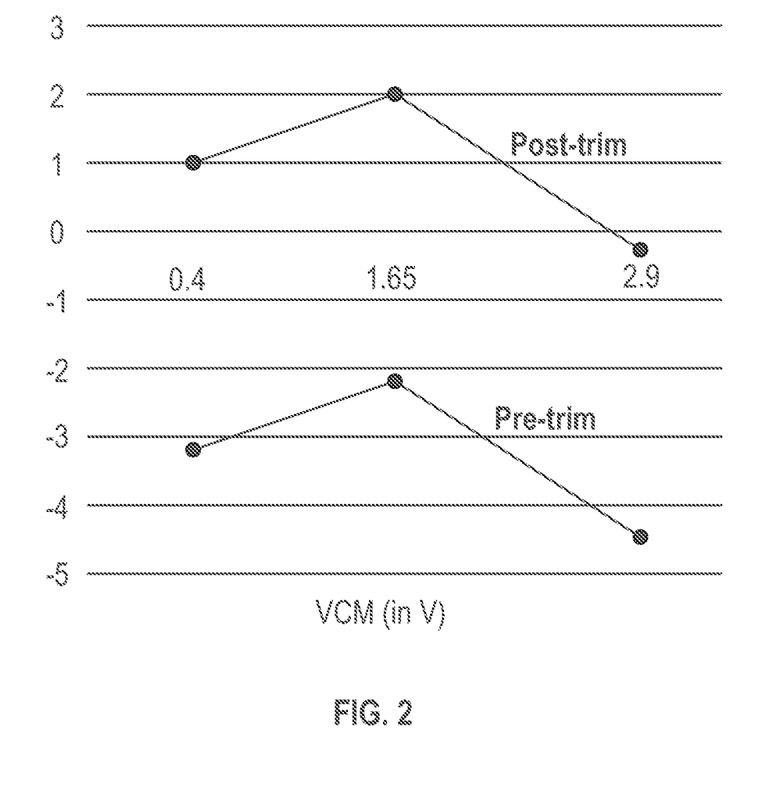
FIG. 2 is an illustration of variation of pre-trim and post-trim offset (in mV) across a VCM range on an example device under test, according to examples of the present disclosure.

For example, FIG. 2 is an illustration of variation of pre-trim and post-trim offset (in mV) across a VCM range on an example device under test. This may represent operation using trim bits 122, 124 in trim circuit 106, but without trim circuit 106. To analyze the efficacy of trim circuit 106 alone, the operation of op-amp 100 may be divided into three ranges according to voltage input-low, mid, and high, wherein in low voltage input, the PMOS transistor pair of differential pair 110 of pre-amplifier 102 is on; in mid voltage input, both the PMOS and NMOS transistor pairs of differential pair 110 of pre-amplifier 102 are on; and in high voltage input, the NMOS transistor pair of differential pair 110 of pre-amplifier 102 is on.

Returning to FIG. 1, the contribution of the PMOS transistor pair of differential pair 110 of pre-amplifier 102 to the offset of op-amp 100 may be given as X. The contribution of the NMOS transistor pair of differential pair 110 of pre-amplifier 102 to the offset of op-amp 100 may be given as Y. The contribution of pre-amplifier output stage 112 to the offset of op-amp 100 may be given as Z. In the low voltage input range, the NMOS transistor pair of differential pair 110 of pre-amplifier 102 may be off, and thus the offset observed may be the result of only X+Z, and thus is nullified by ptrim bits 124, as discussed above. This may be because pre-amplifier output stage 112 may utilize offset correction current 130 to negate the offset due to X (in other words, Z is adjusted such that Z=−X). In the high voltage input range, the PMOS transistor pair of differential pair 110 of pre-amplifier 102 may be off, and thus the offset observed may be the result of only Y+Z, and thus is nullified by ntrim bits 122, as discussed above. This may be because pre-amplifier output stage 112 may utilize offset correction current 130 to negate the offset due to Y (in other words, Z is adjusted such that Z=−Y).

However, for the mid voltage input range, both the NMOS and PMOS transistor pairs of differential pair 110 of pre-amplifier 102 may be active. As a result, with the use of trim circuit 106 alone, offset cancellation may be over-compensated to a total value of −(X+Y+2*Z). Offset may be dominated in various designs of op-amp 100, such as when operational speeds are in the range of approximately 100 MHz, by current mirrors in output stage 104 as the mirrors are optimized or minimized to move their respective mirror poles away from the operational bandwidth. As a result, pre-amplifier output stage 112 may have an inherent offset of its own that contributes to Z, apart from the offsets of differential pair 112, before being adjusted according to offset correction current 130. Moreover, this inherent offset Z of pre-amplifier output stage 112 may be larger than X or Y. Accordingly, for the mid voltage input range, it may be observed that after trimming, the offset is out of an acceptable range of, for example, 2 mV.

This is shown in FIG. 2, which illustrates the output of op-amp 100 given operation of trim circuit 106 but without operation of trim circuit 108 for an example device. The output of op-amp 100 is illustrated as voltage output expressed in mV in the y-axis, over a range of possible input voltages on the x-axis. As input voltage changes from low (−0.4 V) to high (2.9 V, an approximation of AVDD-0.4V), an over-correction occurs in the mid voltage input range. This occurs whether or not trim is applied. Even if trim is applied, wherein the response of op-amp 100 is brought within an expected range for endpoints (−0.4 V, 2.9 V), the response of op-amp 100 may exceed the expected range while in the mid voltage range output, wherein the response exceeds 2 mV.

Returning to FIG. 1, in order to provide output response within prescribed limits across the possible rail-to-rail input range, in one example op-amp 100 may utilize trim circuit 108 to be operable to provide VCM correction current 132 to pre-amp output stage 112 when both PMOS and NMOS transistor pairs of differential pair 110 are active. To do so, trim circuit 108 may be configured to receive ptrim bits 128 and ntrim bit 126. In one example, trim circuit 108 may be configured to provide a VCM correction current 132 that may be added to or subtracted from offset correction current 130 to provide improved output response of pre-amp output stage 112 during mid voltage input range values. In one example, trim circuit may be configured to provide a VCM correction current 132 that is of a different polarity than offset correction current 130. In one example, pre-amp output stage 112 may be configured to provide a VCM correction current 132 that is of a magnitude that is less than offset correction current 130. In such an example, trim circuit 108 may be configured to provide VCM correction current 132 that is negative one-half of offset correction current 130. Although one-half is used as an example value, other fractions may be used, such as three-fourths, two-thirds, one-third, one-fourth. Pre-amp output stage 112 may be configured to reduce output that would have been provided by offset correction current 130 by an amount specified by VCM correction current 132. Pre-amp output stage 112 may be configured to apply correction currents 130, 132 in any suitable manner to the output of differential pair 110.

In one example, trim circuit 108 may receive same values in ntrim bits 126 and ptrim bits 128 as was received by tri circuit 106 in ntrim bits 122 and ptrim bits 124. In such an example, trim circuit 108 may be configured to provide VCM correction current 132 that is negative one-half of offset correction current 130 based upon the same trim bit values that were received by trim circuit 106. In other examples, ntrim bits 126, ptrim bits 128 may be different from ntrim bits 122, ptrim bits 124 but specify that VCM correction current 132 is to be negative one-half of offset correction current 130. If a single one or neither of the PMOS transistor pair and NMOS transistor pair are not on, then VCM correction current may be zero.

Pre-amp output stage 112 may include arms of a folded-cascode output circuit. Pre-amp output stage 112 may be configured to add and subtract correction currents 130, 132 in the arms of the folded-cascode output circuit. In examples of the present disclosure, during mid voltage input range, correction currents 130, 132 may be halved compared to low or high voltage input range, or another fraction as defined by the value of VCM correction current 132.

Trim circuit 106 and trim circuit 108 may be implemented in any suitable manner. Trim circuit 106 and trim circuit 108 may be implemented by analog circuitry, digital circuitry, control logic, or any suitable combination thereof. Trim circuit 106 may include an input voltage sensor 114 and a current generation circuit such as IDAC 116. Trim circuit 108 may include an input voltage sensor 120 and a current generation circuit such as IDAC 118. Sensors 114, 120 and IDACs 116, 120 may be implemented by analog circuitry, digital circuitry, control logic, or any suitable combination thereof.

Input voltage sensor 114 and input voltage sensor 120 may be configured to determine a differential input voltage between VIN+ and VIN−. Based upon this differential, input voltage sensor 114 may be configured to signal to IDAC 116 so that IDAC 116 may generate an appropriate value for offset correction current 130, adjusting the current according to ntrim bits 122 and ptrim bits 124 to accommodate an input offset of op-amp 100. Furthermore, based upon this differential, input voltage sensor 120 may be configured to signal to IDAC 118 so that IDAC 120 may generate an appropriate value for VCM correction current 1302, adjusting the current according to ntrim bits 126 and ptrim bits 128 to accommodate effects of common mode voltage on inputs of op-amp 100.

In order to signal or provide input into IDACs 116, 118, sensors 116, 120 may provide any suitable signal. In one example, sensors 114, 120 may respectively a provide nbias signal and a pbias signal to IDACs 116, 118. The nbias and the pbias signals may be voltage or current-based. The nbias and pbias signals may be used a base value on which correction currents 130, 132 generated by IDACs 116, 118 is based. IDAC 118 may be configured to adjust down the current that would otherwise be generated by the input voltage, compared to IDAC 116. Furthermore, IDAC 118 may be configured to reverse the polarity of the current that would otherwise be generated by the input voltage, compared to IDAC 116.

Each of trim circuits 106, 108 include a replica circuit and a voltage controlled current source configured to generate input signals for IDACs 116, 118. In FIG. 1, these may be represented by sensors 114, 120 though the replica circuit and voltage controlled current source may be implemented in any suitable part of trim circuits 106, 108, such as in IDACs 116, 118.

Input voltage sensors 120 may be configured to receive VIN+ and VIN- and determine whether the input voltage is within the low voltage input range, mid voltage input range, or high voltage input range. The replica circuit to implement input voltage sensor 114 in trim circuit 106 may include a pair of PMOS transistors and a pair NMOS transistors implemented as in differential pair 110. However, the replica circuit to implement input voltage sensor 120 in trim circuit 108 may include a pair of NMOS transistors and a pair of PMOS transistors implemented differently than in differential pair 110 in that the pair of NMOS transistors and the pair of PMOS transistors may be connected to each other in series.

Figure 3:
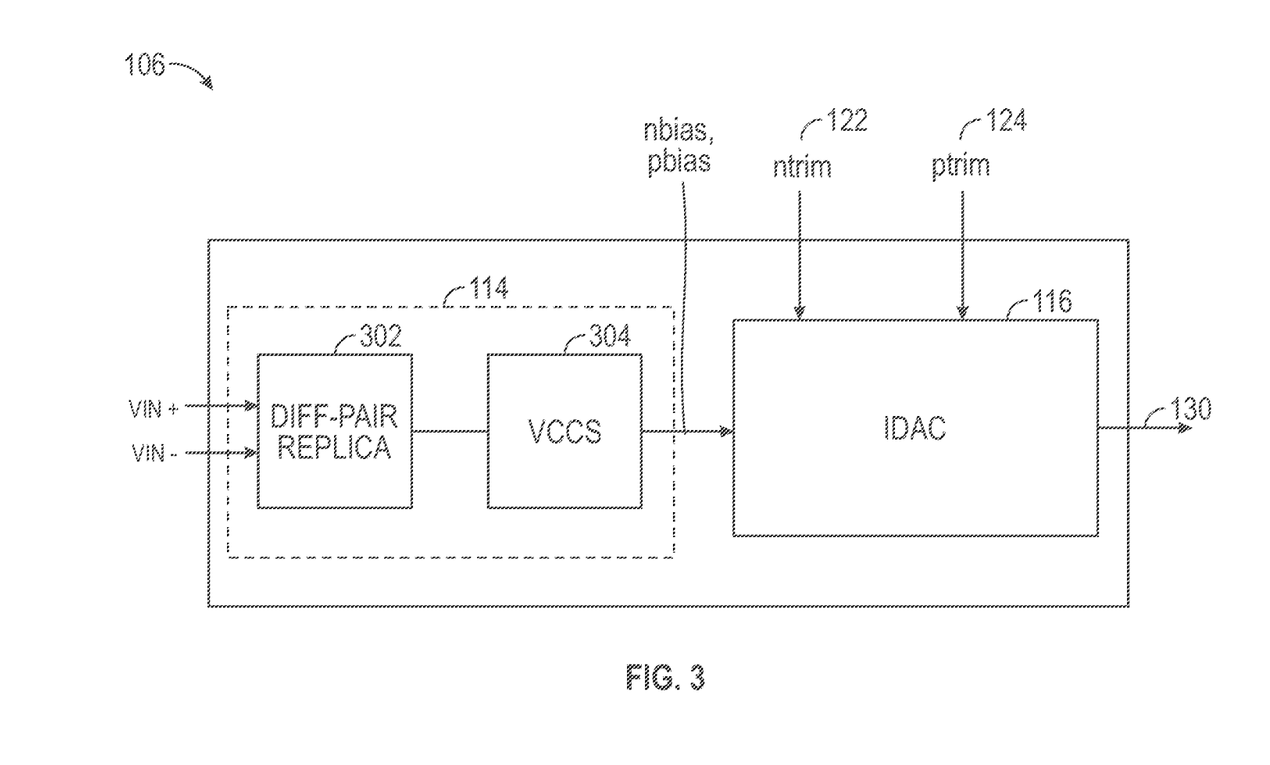
FIG. 3 is a more detailed illustration of an illustration of a first trim circuit, according to examples of the present disclosure.

FIG. 3 is a more detailed illustration of an illustration of trim circuit 106, according to examples of the present disclosure. Voltage sensor 114 may include a differential pair replica circuit 302 and a voltage controlled current source 304. Differential pair replica circuit 302 may be implemented with a differential pair of NMOS transistors and a differential pair of PMOS transistors, and may be a replica of differential pair 110. Differential pair replica circuit 302 may be configured to provide an output to voltage controlled current source 304 that is non-zero only across all three conditions, wherein the pair of NMOS transistors is off and the pair of PMOS transistors is on in a low voltage input range; the pair of NMOS transistors is on and the pair of PMOS transistors is on in a mid voltage input range; and, the pair of NMOS transistors is on and the pair of PMOS transistors is off in a high voltage input range. This may mirror the full operation of differential pair 110. The output of differential pair replica circuit 302 may be provided to voltage controlled current source 304.

Voltage controlled current source 304 may be implemented in any suitable manner, such as by a DAC, current source, analog circuitry, digital circuitry, any suitable combination thereof, or any other suitable mechanism for generating an nbias and pbias signal for IDAC 116.

Figure 4:
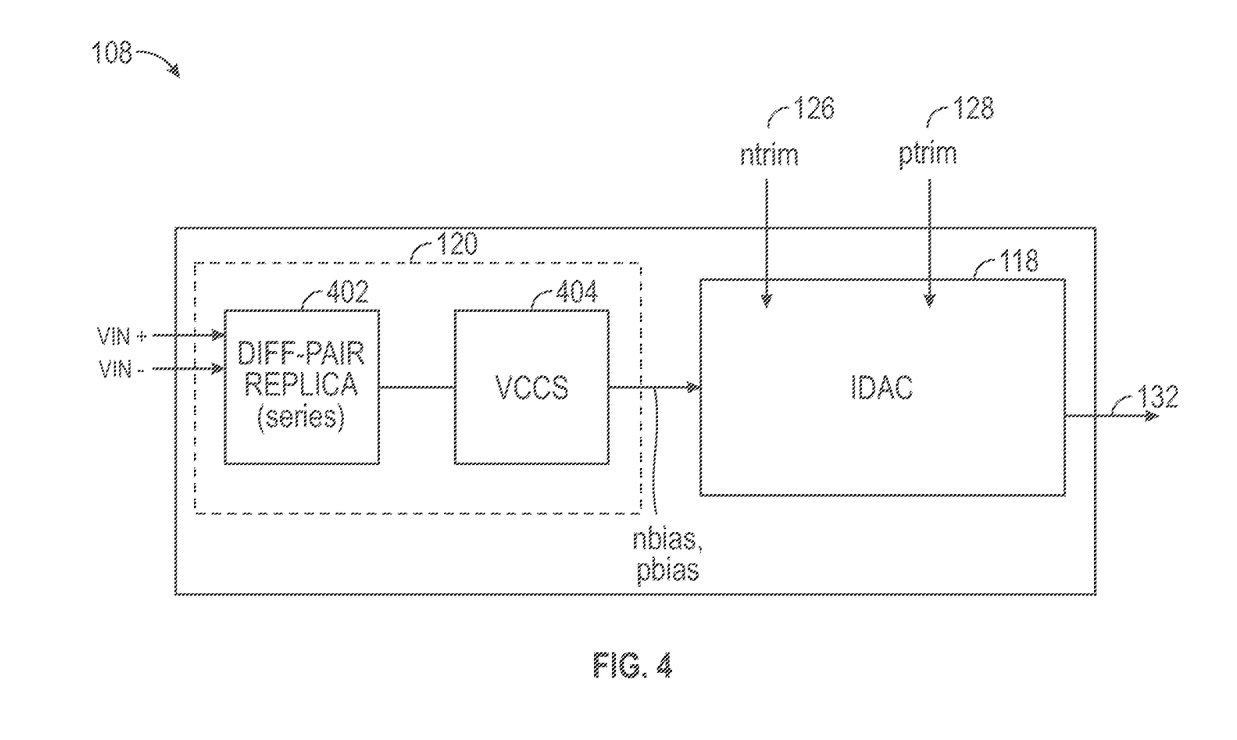
FIG. 4 is a more detailed illustration of a voltage sensor, according to examples of the present disclosure.

FIG. 4 is a more detailed illustration of voltage sensor 120, according to examples of the present disclosure. Voltage sensor 120 may include a differential pair replica circuit 402 and a voltage controlled current source 404. Differential pair replica circuit 402 may be implemented with a differential pair of NMOS transistors and a differential pair of PMOS transistors, and may be a replica of differential pair 110, except that the NMOS and PMOS transistor pairs therein may be connected in series. This may cause differential pair replica circuit 402 to be configured to provide an output to voltage controlled current source 404 that is non-zero only when the pair of NMOS transistors is on and the pair of PMOS transistors is on. This may reflect only the conditions in which the pair of NMOS transistors is on and the pair of PMOS transistors is on in differential pair 110. The output of differential pair replica circuit 402 may be provided to voltage controlled current source 404.

Voltage controlled current source 404 may be implemented in any suitable manner, such as by a DAC, current source, analog circuitry, digital circuitry, any suitable combination thereof, or any other suitable mechanism for generating an nbias and pbias signal for IDAC 118.

Differential pair replica circuit 402 may be configured to provide current or voltage signals to voltage controlled current source 402 that reflect whether the input voltage range is mid range, or is otherwise zero. These signals may in turn be reflected in nbias and pbias signals that are provided to IDAC 116.

Accordingly, nbias and pbias may be zero unless the input voltage is in the mid range, causing both the NMOS and PMOS transistor pairs of replica circuit 402 to on.

Returning to FIG. 1, as discussed above, trim circuit 106 may be configured to generate offset correction current 130 with a magnitude of I, while trim circuit 108 may be configured to generate VCM correction current 132 with a magnitude that is a fraction of I, and that the fraction may be approximately half. Moreover, trim circuit 108 may be configured to generate VCM correction current 132 with an opposite polarity (sink versus source, push versus pull, positive versus negative) compared to offset correction current 130. Trim circuit 108 may be configured to generate VCM correction current 130 with such a magnitude in any suitable manner.

In one example, IDACs 116, 118 may be implemented in a different manner to generate a fraction of the current in trim circuit 108 as compared to trim circuit 106. In such an example, given the same nbias and pbias inputs, IDAC 118 may be implemented in a manner to generate a fraction of the current as compared to IDAC 116. This may be implemented by, for example, using differently sized, configured, or implemented transistors in IDAC 118 compared to IDAC 116. Thus, the implementation of IDAC 118 and IDAC 116 may be different. Moreover, outputs of IDAC 118 may be adjusted or reversed to cause the polarity of VCM correction current 132 to be the opposite of offset correction current 130. In such an implementation, for a given voltage input, ntrim bits 122, 126 may be the same and ptrim bits 124, 128 may be the same. In addition, for such an implementation, for a mid voltage input range, the nbias and pbias signals generated by sensors 114, 120 may be the same. However, in the low voltage input range and in the high voltage input range, the nbias and pbias signals generated by sensor 108 may be zero. Also, for such an implementation, replica circuits 302, 402 may be implemented in a same manner except that replica circuit 402 includes differential pairs in series. Voltage controlled current sources 304, 404 may be implemented in a same manner.

In one example, replica circuits 302, 402 may be implemented in a different manner to generate a fraction of the current in trim circuit 108 as compared to trim circuit 106 as reflected in different correction currents 130, 132. In such an example, replica circuit 402 may be configured to generate signals that, in the mid voltage input range, cause voltage controlled current source 404 to generate pbias and bias signals that will cause IDAC 118 to generate correction current 132 to be a fraction of correction current 130.

In one example, voltage controlled current sources 304, 404 may be implemented in a different manner to generate a fraction of the current in trim circuit 108 as compared to trim circuit 106 as reflected in different correction currents 130, 132. In such an example, voltage controlled current source 404 may be configured to, given a same input as provided to voltage controlled current source 404, generate pbias and nbias signals that will cause IDAC 118 to generate correction current 132 to be a fraction of correction current 130.

In one example, trim circuit 108 may utilize ntrim bits 126 and ptrim bits 128 with values that will cause, in relation to ntrim bits 122 and ptrim bits 124 as applied to trim circuit 106, a magnitude that of VCM correction current 132 that is one-half or another fraction of offset correction current 130. In such an example, trim circuits 106, 108 may be implemented in a same manner.

Figure 5:
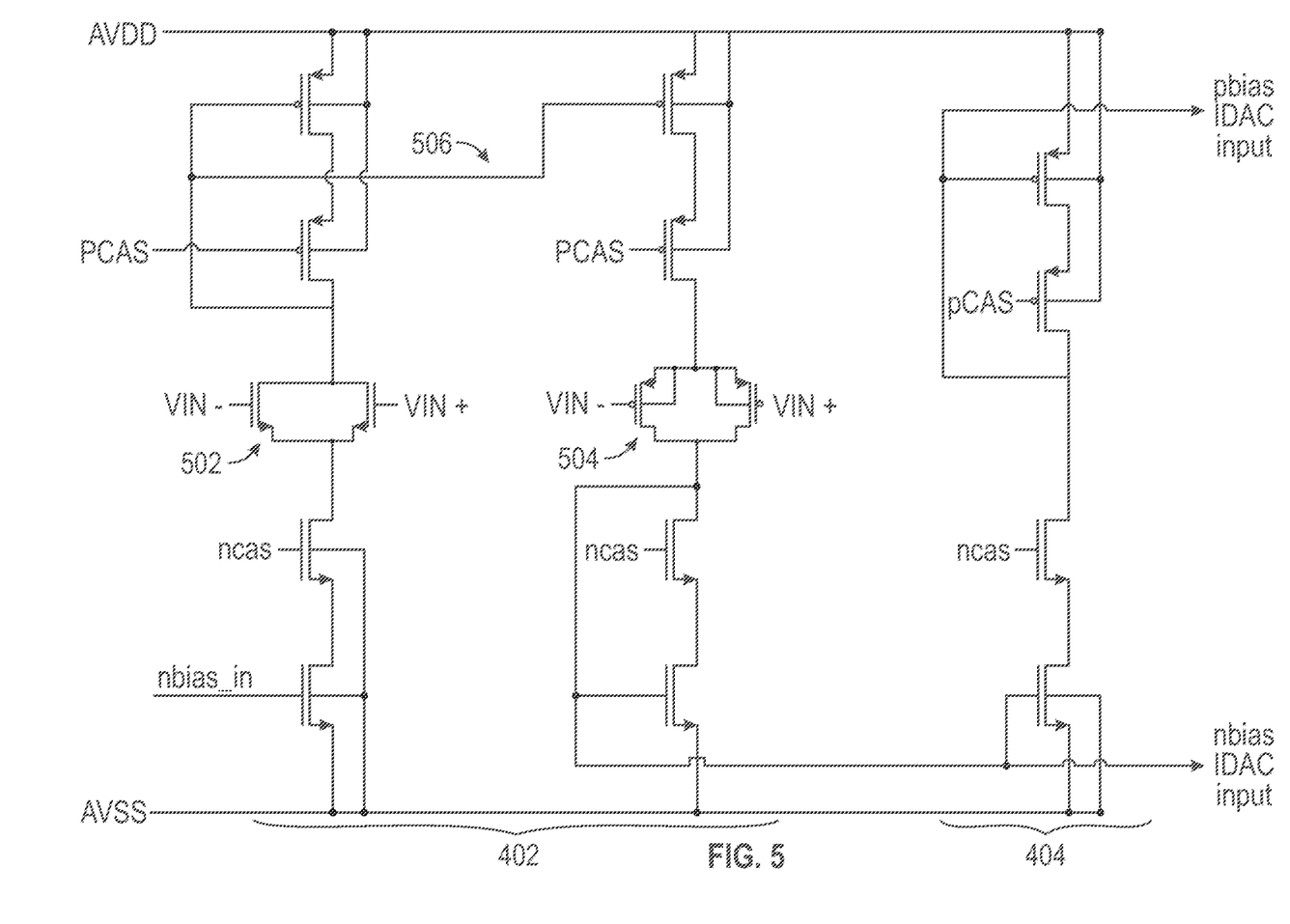
FIG. 5 is an illustration of an example implementation of a second trim circuit, according to examples of the present disclosure.

FIG. 5 is an illustration of an example implementation of trim circuit 108, according to examples of the present disclosure. Illustrated in FIG. 5 are example implementations of differential pair replica circuit 402 and voltage controlled current source 404. As shown, differential pair replica circuit 402 may include a pair 502 of PMOS transistors and a pair 504 of NMOS transistors. These may be placed in series by connection 506. Pair 502 and pair 504 may include inputs from the voltage input of op-amp 100. Other transistors may be used as shown in order to facilitate the output of switching both these pairs 502, 504 on when the input voltage is within the mid voltage input range. Various bias currents or voltages may be used, such as pcas—a PMOS cascode voltage vias; ncas—an NMOS cascode voltage bias; and nbiasn_in—an input nbias reference. Also used may be system analog VDD and VSS, given as AVDD and AVSS.

Output from pair 504 may be provided to voltage controlled current source 404. Output from pair 504 may be non-zero only if the input voltage is within the mid voltage input range, wherein both pairs 502, 504 are on, which may replicate the operation of differential pair 110. Pairs 502, 504 may be of a different size or output voltage compared to differential pair 110, but may reflect the same or similar operational characteristics compared to differential pair 110.

Voltage controlled current source 404, given the input from differential pair replica circuit 402, may be configured to generate pbias and nbias inputs to IDAC 118.

Figure 6:
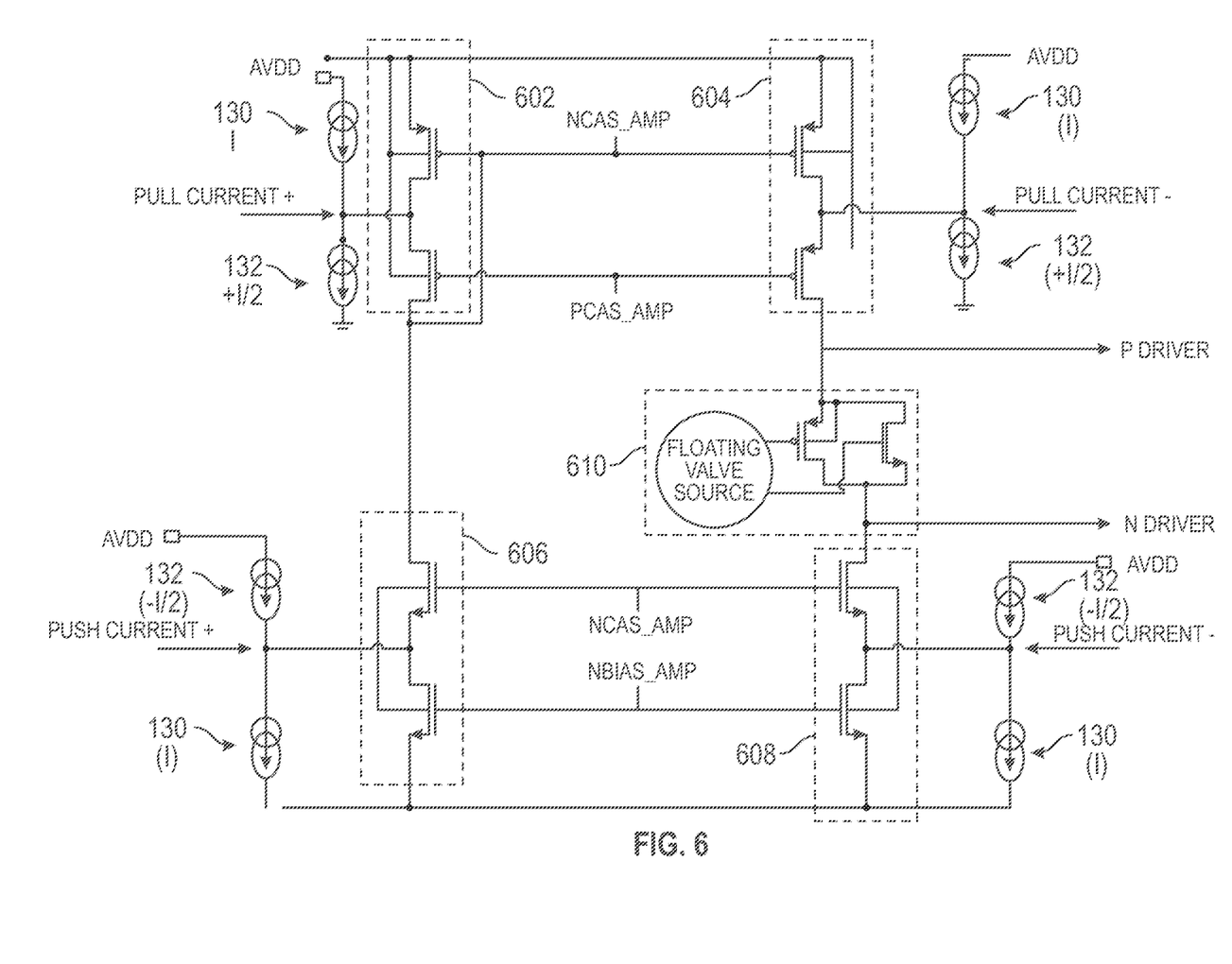
FIG. 6 is an illustration of an example implementation of a pre-amplifier output stage, according to examples of the present disclosure.

FIG. 6 is an illustration of an example implementation of pre-amplifier output stage 112, according to examples of the present disclosure. Pre-amplifier output stage 112 may be configured to receive push and pull signals as input from differential pair 110, reflecting the input voltage. The push and pull signals may be differential signals. The push and pull signals may be implemented as, for example, a voltage or a current. Pre-amplifier output stage 112 may receive a push current from the PMOS transistor pair of differential pair 110. Moreover, pre-amplifier output stage 112 may receive a pull current from the NMOS transistor pair of differential pair 110. Pre-amplifier output stage 112 may be configured to generate output signals to op-amp output stage 104. Such output signals may include a p-driver signal and n-driver signal.

Pre-amplifier output stage 112 may include a first arm 612 and a second arm 614. First arm 612 may include a series of transistors. The series of transistors may include PMOS cascode arrangement 602, which may include two transistors connected in series. A top of PMOS cascode arrangement 602 may be connected to AVDD. The series of transistors may include NMOS cascode arrangement 606, which may include two transistors connected in series. A top of NMOS cascode arrangement 606 may be connected to a bottom of PMOS cascode arrangement 602, and a bottom of NMOS cascode arrangement 606 may be connected to AVSS or ground. Second arm 614 may include a series of transistors and a floating voltage source 610. The series of transistors may include PMOS cascode arrangement 604, which may include two transistors connected in series. A bottom of PMOS cascode arrangement 604 may be connected to a top of floating voltage source 610. A bottom of floating voltage source 610 may be connected to a top of NMOS cascode arrangement 608, which may include two transistors connected in series. A bottom of NMOS cascode arrangement 606 may be connected to AVSS or ground.

Floating voltage source 610 may be configured to provide an alternating current (AC) short circuit between the P driver and N driver output signals.

Pull current may be input to a top portion of arms 612, 614. For example, a positive pull current may be input to the midpoint of transistors of PMOS cascode arrangement 602. A negative pull current may be input to the midpoint of transistors of PMOS cascode arrangement 604. Push current may be input to a bottom portion of arms 612, 614. For example, a positive push current may be input to the midpoint of transistors NMOS cascode arrangement 606. A negative pull current may be input to the midpoint of transistors of NMOS cascode arrangement 608.

Offset correction current 130, with an approximate current of I, may be added to or subtracted from the push or pull signals received from differential pair 110. For example, offset correction current 130 may be routed to arrangements 602, 604, 606, 608. Offset correction current 130 may be added to pull current at the midpoint of the transistors of arrangements 602, 604. Offset correction current 130 may be subtracted from push current at the midpoint of the transistors of arrangements 606, 608. Such use of offset correction current 130, without additional use of VMC correction current 132, may result in the operation as shown in FIG. 2, for example.

In one example, VCM correction current 132 may be also routed to arrangements 602, 604, 606, 608. VCM correction current 132 may be non-zero only when input voltage to op-amp 100 is within the mid voltage input range, when both the NMOS transistor pair and the PMOS transistor pair of differential pair 110 are active, as discussed above. VCM correction current 132, with an approximate current of a magnitude of I/2, may be subtracted from offset correction current 130 and the push current at the midpoint of arrangement 602. VCM correction current 132, with an approximate current of a magnitude of I/2, may be subtracted from offset correction current 130 and the pull current at the midpoint of arrangement 604. This may have the effect of VCM correction current 132 being approximately −I/2. VCM correction current 132 with a current of approximately −I/2 may be added to offset correction current 130 and push current at the midpoint of arrangement 606. VCM correction current 132 with a current of approximately −I/2 may be added to offset correction current 130 and push current at the midpoint of arrangement 608. This may selectively reduce the effect of offset correction current 130 during the mid voltage input range.

Figure 7:
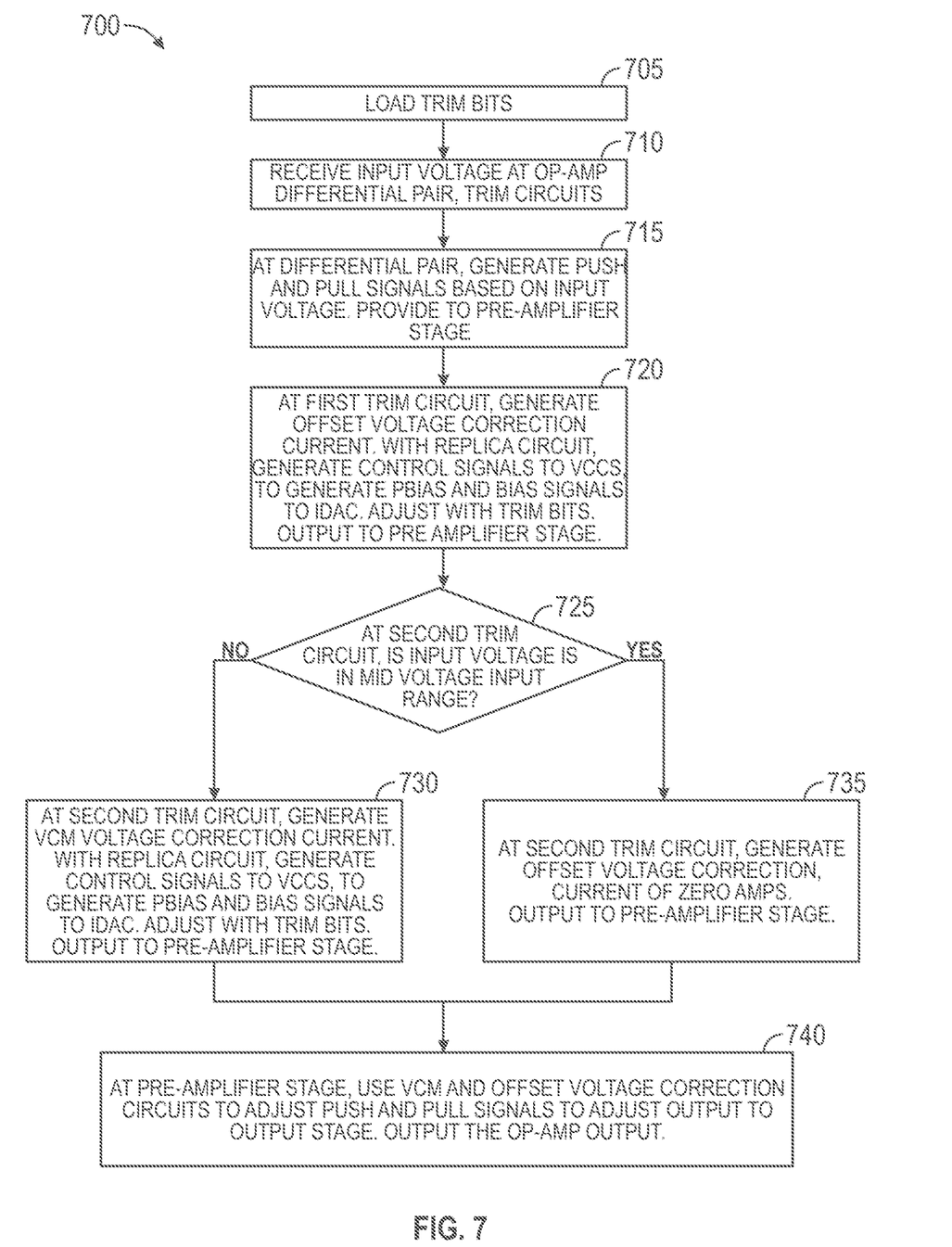
FIG. 7 is an illustration of an example method for trimming offset across the entire input range of an op-amp with rail-to-rail input, according to examples of the present disclosure.

FIG. 7 is an illustration of an example method 700 for trimming offset across the entire input range of an op-amp with rail-to-rail input, according to examples of the present disclosure. Method 700 may be performed by any suitable system, such as the op-amp of FIGS. 1-6. Method 700 may include any suitable number of steps, including more or fewer than those shown in FIG. 7. Moreover, the steps of method 700 may be optionally repeated, omitted, performed in parallel, performed in a different order, or performed recursively.

At 705, trim bits may be loaded into an op-amp. The trim bits may be loaded from, for example, from a register or other suitable memory.

At 710, an input voltage to the op-amp may be received. The input voltage may be input to a differential pair. The input voltage may be input into a replica circuit of a first trim circuit. The replica circuit may be of the differential pair. The input voltage may be input into a replica circuit of a second trim circuit. The replica circuit may be of the differential pair.

At 715, the differential circuit may generate push and pull signals that represent a differential voltage of the voltage input. The push and pull signals may be output to a pre-amplifier stage.

At 720, at the first trim circuit, an offset voltage correction current may be generated. To do so, the replica circuit may generate control signals to a voltage controlled current source, which may provide nbias and pbias signals to a current generator such as an IDAC. The IDAC may load the trim bits to adjust the offset voltage correction current to a designated value. The offset voltage correction current may be output to the pre-amplifier stage.

At 725, at the second trim circuit, it may be determined whether the input voltage is in a mid voltage input range. If so, method 700 may proceed to 730. Otherwise, method 700 may proceed to 735.

At 730, at the second trim circuit, a VCM correction current with a non-zero value, with as approximately half of the magnitude of the offset correction current, may be generated. The replica circuit may generate control signals to a voltage controlled current source, which may provide nbias and pbias signals to a current generator such as an IDAC. The IDAC may load the trim bits to adjust the offset voltage correction current to a designated value. The VCM correction current may be output to the pre-amplifier stage. Method 700 may proceed to 740.

At 735, at the second trim circuit, a VCM correction current with zero value, may be generated. Method 700 may proceed to 740.

At 740, at a pre-amplifier stage, VCM correction currents and offset correction currents may be used to adjust the output that otherwise would be provided to an output stage. Then, the output stage may output the op-amp output.

Examples of the present disclosure may address challenges in reducing offset of an op-amp across the whole input range. In contrast to examples of the present disclosure, other methods like chopping, auto-zeroing require additional inputs like clock and are thus expensive. Examples of the present disclosure might not require any changes in the overall trim methodology i.e., same steps lead to low offset across whole input range. Examples of the present disclosure might not require any additional trim-bits for mid-VCM inputs.

Examples of the present disclosure include an op-amp. The op-amp may include a pre-amplifier circuit, a first trim circuit, and a second trim circuit.

The pre-amplifier circuit may include a first differential pair. The first differential pair may include an NMOS pair of transistors and a PMOS pair of transistors. The pre-amplifier circuit may be configured to receive an input voltage for the op-amp at the first differential pair.

The first trim circuit may include a first current source. The first current source may be configured to produce an offset voltage correction current and provide the offset voltage correction current to the pre-amplifier circuit to correct an input offset of the operational amplifier.

The second trim circuit may include a second current source. The second current source may be configured to produce VCM correction current and provide the VCM voltage correction current to the pre-amplifier circuit. The second trim circuit may be configured to, when the input voltage is within a mid voltage input range, cause the VCM correction current to have a non-zero value to reduce a correction caused by the offset voltage correction current. The mid voltage input range may cause both the NMOS pair of transistors and the PMOS pair of transistors of the differential pair to be active. The second trim circuit may be configured to, when the input voltage is not within the mid voltage input range, cause the VCM correction current to have a zero value or not be produced.

The pre-amplifier circuit may be configured to apply the offset correction current and the VCM correction current to output signals of the differential pair.

The pre-amplifier circuit, the trim circuits, and other components of the op-amp may be implemented with digital circuitry, control logic, analog circuitry, instructions for execution by a processor, an ASIC, an FPGA, or any suitable combination thereof. The current sources may be implemented by, for example, an IDAC or any other suitable current source.

In combination with any of the above embodiments, the trim circuits may each include an input voltage sensor. The input voltage sensors of the trim circuits may be implemented with digital circuitry, control logic, analog circuitry, instructions for execution by a processor, an ASIC, an FPGA, or any suitable combination thereof. The input voltage sensors may be configured to receive the voltage input of the op-amp as an input. The input voltage sensors may be configured to receive the voltage input and generate any suitable signal to the current sources, such as nbias and pbias signals, such as nbias and pbias currents, that reflect the input voltage.

In combination with any of the above embodiments, the second trim circuit may further include a second differential pair. The second differential pair may include an NMOS pair of transistors and a PMOS pair of transistors. The NMOS pair of transistors and PMOS pair of transistors may be connected in series. The series connection may cause a nonzero output bias current to be output from the second differential pair when the input voltage is within the mid voltage input range. The input voltage sensor of the second trim circuit may include the second differential pair.

In combination with any of the above embodiments, the first trim circuit may further include a third differential pair. The third differential pair may include an NMOS pair of transistors and a PMOS pair of transistors. The NMOS pair of transistors and PMOS pair of transistors may be connected in parallel. The parallel connection may cause various outputs of the third differential pair, depending upon whether the input voltage is within a low voltage input range, the mid voltage input range, or a high voltage input range. The input voltage sensor of the first trim circuit may include the third differential pair.

In combination with any of the above embodiments, the NMOS pair of transistors and PMOS pair of transistors of the second differential pair may be connected in series to cause the nonzero output bias current to be output from the second differential pair when the NMOS pair of transistors and the PMOS pair of transistors of the second differential pair are both active.

In combination with any of the above embodiments, the pre-amplifier circuit may be configured to subtract the VCM correction current from the offset voltage correction current and apply a result to output signals of the differential pair.

In combination with any of the above embodiments, the pre-amplifier circuit may be configured to add the VCM correction current from the offset voltage correction current and apply a result to output signals of the differential pair.

In combination with any of the above embodiments, the pre-amplifier circuit may be configured to apply the VCM correction current and the offset voltage correction current to a push signal from the differential pair.

In combination with any of the above embodiments, the pre-amplifier circuit may be configured to apply the VCM correction current and the offset voltage correction current to a pull signal from the differential pair.

In combination with any of the above embodiments, the pre-amplifier circuit may include two arms. The two arms may each include two transistor arrangements. The transistor arrangements may be connected to each other in series. The transistor arrangements themselves ay include two transistors connected to each other in series. In an output arm, a floating voltage source may be connected between the two transistor arrangements. The pre-amplifier circuit may be configured to apply the VCM correction current and the offset voltage correction to input push or pull currents from the differential pair at midpoints of each of the transistor arrangements.

Examples of the present disclosure may include an apparatus. The apparatus may include a pre-amplifier circuit and a first and second trim circuits. The pre-amplifier circuit and the trim circuits may be implemented fully or in part by any of the above embodiments. The pre-amplifier circuit may include a pre-amplifier output stage circuit and a first differential pair. The first differential pair may include an NMOS pair of transistors and a PMOS pair of transistors. The first differential pair may receive an input voltage for an operational amplifier.

In combination with any of the above embodiments, the first trim circuit may include a first replica circuit and a first current source. The first replica circuit may include transistors that are a replica of transistors of the first differential pair. The first trim circuit through the first current source may be configured to provide a non-zero value of the offset voltage correction current when the input voltage is in each of a low voltage input range, a mid voltage input range, and a high voltage input range.

In combination with any of the above embodiments, a second trim circuit may include a second replica circuit and a second current source. The second replica circuit may include transistors that are a replica of transistors of the first differential pair. The second trim circuit may be configured to provide the VCM correction current with a non-zero value when the input voltage is in the mid voltage input range, and provide the VCM correction current with a zero value when the input voltage is in the low voltage input range and the high voltage input range.

In combination with any of the above embodiments, the first trim circuit and the second trim circuit are to receive a same set of trim bits. The first current source may be configured to select a value of the offset voltage correction current based upon the set of trim bits. The second current source may be configured to select a value of the VCM correction current based upon the set of trim bits. The trim bits may be set or received in any suitable manner.

In combination with any of the above embodiments, the VCM correction current may be less than the offset voltage correction current when the input voltage is in the mid voltage input range. The VCM correction current may be, for example, of a magnitude of approximately one half of the offset voltage correction current. The VCM correction current may be generated with a same nbias or pbias input as is used to generate the offset voltage correction current. The VCM correction current may be so generated by inclusion of transistors of different sizes in the voltage sensor of the second trim circuit as compared to the transistors of the first trim circuit.

In combination with any of the above embodiments, the first replica circuit may include an NMOS pair of transistors and a PMOS pair of transistors connected in parallel. The second replica circuit may include an NMOS pair of transistors and a PMOS pair of transistors connected in series. In combination with any of the above embodiments, the first replica circuit and the second replica circuit may be configured to provide a same output signal when the input voltage is in the mid voltage input range. In combination with any of the above embodiments, the first current source and the second current source may be implemented in a different manner.

Examples of the present disclosure may include methods performed by any of the above examples.

The present disclosure has been described in terms of one or more examples, and it should be appreciated that many equivalents, alternatives, variations, and modifications, aside from those expressly stated, are possible and within the scope of the disclosure. While the present disclosure is susceptible to various modifications and alternative forms, specific examples thereof have been shown in the drawings and are herein described in detail. It should be understood, however, that the description herein of specific examples is not intended to limit the disclosure to the particular forms disclosed herein.

What is claimed is:

1. An operational amplifier, comprising:
    a pre-amplifier circuit, including a first differential pair, the first differential pair including an NMOS pair of transistors and a PMOS pair of transistors, the pre-amplifier circuit to receive an input voltage at the first differential pair;
    a first trim circuit to which the input voltage is supplied, the first trim circuit including a first current source, the first current source to produce an offset voltage correction current dependent upon the input voltage and provide the offset voltage correction current to the pre-amplifier circuit to correct an offset of the operational amplifier;
    a second trim circuit to which the input voltage is supplied, the second trim circuit including a second current source, the second current source to produce a common mode voltage (VCM) correction current dependent upon the input voltage and provide the VCM voltage correction current to the pre-amplifier circuit, wherein the second trim circuit is to:
        when the input voltage is within a mid voltage input range, the mid voltage input range to cause both the NMOS pair of transistors and the PMOS pair of transistors to be active, cause the VCM correction current to have a non-zero value to reduce a correction caused by the offset voltage correction current; and
        when the input voltage is not within the mid voltage input range, cause the VCM correction current to have a zero value or not be produced;
    wherein the pre-amplifier circuit is to apply the offset voltage correction current and the VCM correction current to output signals of the differential pair.

2. The operational amplifier of claim 1, wherein the second trim circuit further includes a second differential pair, the second differential pair include an NMOS pair of transistors and a PMOS pair of transistors, the NMOS pair of transistors and PMOS pair of transistors connected in series to cause a nonzero output bias current to be output from the second differential pair when the input voltage is within the mid voltage input range.

3. The operational amplifier of claim 2, wherein the NMOS pair of transistors and PMOS pair of transistors of the second differential pair are connected in series to cause the nonzero output bias current to be output from the second differential pair when the NMOS pair of transistors and the PMOS pair of transistors of the second differential pair are both active.

4. The operational amplifier of claim 1, wherein the pre-amplifier circuit is to subtract the VCM correction current from the offset voltage correction current and apply a result to output signals of the differential pair.

5. The operational amplifier of claim 1, wherein the pre-amplifier circuit is to add the VCM correction current from the offset voltage correction current and apply a result to output signals of the differential pair.

6. The operational amplifier of claim 1, wherein the pre-amplifier circuit is to apply the VCM correction current and the offset voltage correction current to a push signal from the differential pair.

7. The operational amplifier of claim 1, wherein the pre-amplifier circuit is to apply the VCM correction current and the offset voltage correction current to a pull signal from the differential pair.

8. A method of operating an operational amplifier, comprising:
with a pre-amplifier circuit, the pre-amplifier including a first differential pair, the first differential pair including an NMOS pair of transistors and a PMOS pair of transistors, receiving an input voltage at the first differential pair;
with a first trim circuit to which the input voltage is supplied, the first trim circuit including a first current source, producing with the first current source an offset voltage correction current dependent upon the input voltage and providing the offset voltage correction current to the pre-amplifier circuit to correct an offset of the operational amplifier;
with a second trim circuit to which the input voltage is supplied, the second trim circuit including a second current source:
producing a common mode voltage (VCM) correction current dependent upon the input voltage and providing the offset voltage correction current to the pre-amplifier circuit:
when the input voltage is within a mid voltage input range, the mid voltage input range to cause both the NMOS pair of transistors and the PMOS pair of transistors to be active, causing the VCM correction current to have a non-zero value to reduce a correction caused by the offset voltage correction current; and
when the input voltage is not within the mid voltage input range, causing the VCM correction current to have a zero value or not be produced;
with the pre-amplifier circuit, applying the offset voltage correction current and the VCM correction current to output signals of the differential pair.

9. The method of claim 8, wherein the second trim circuit further includes a second differential pair, the second differential pair include an NMOS pair of transistors and a PMOS pair of transistors, and wherein the NMOS pair of transistors and PMOS pair of transistors are connected in series to cause a nonzero output bias current to be output from the second differential pair when the input voltage is within the mid voltage input range.

10. The method of claim 9, wherein the NMOS pair of transistors and PMOS pair of transistors of the second differential pair are connected in series, causing the nonzero output bias current to be output from the second differential pair when the NMOS pair of transistors and the PMOS pair of transistors of the second differential pair are both active.

11. The method of claim 8, comprising, with the pre-amplifier circuit, subtracting the VCM correction current from the offset voltage correction current and apply a result to output signals of the differential pair.

12. The method of claim 8, comprising, with the pre-amplifier circuit, adding the VCM correction current from the offset voltage correction current and apply a result to output signals of the differential pair.

13. The method of claim 8, comprising, with the pre-amplifier circuit, applying the VCM correction current and the offset voltage correction current to a push signal from the differential pair.

14. The method of claim 8, with the pre-amplifier circuit, applying the VCM correction current and the offset voltage correction current to a pull signal from the differential pair.

15. An apparatus, comprising:
a pre-amplifier circuit including a pre-amplifier output stage circuit and a first differential pair, the first differential pair including an NMOS pair of transistors and a PMOS pair of transistors, the first differential pair to receive an input voltage for an operational amplifier;
a first trim circuit to which the input voltage is supplied, the first trim circuit including a first replica circuit and a first current source, the first replica circuit including transistors that are a replica of transistors of the first differential pair, the first current source to produce an offset voltage correction current, wherein the first trim circuit is to provide a non-zero value of the offset voltage correction current when the input voltage is in each of a low voltage input range, a mid voltage input range, and a high voltage input range;
a second trim circuit including a second replica circuit and a second current source, the second replica circuit including transistors that are a replica of transistors of the first differential pair, the second current source to produce a common mode voltage (VCM) correction current, wherein the second trim circuit is to:
provide the VCM correction current with a non-zero value when the input voltage is in the mid voltage input range; and
provide the VCM correction current with a zero value when the input voltage is in the low voltage input range and the high voltage input range;
wherein the pre-amplifier output stage circuit is to apply the offset voltage correction current and the VCM correction current to output signals of the differential pair.

16. The apparatus of claim 15, wherein:
the first trim circuit and the second trim circuit are to receive a same set of trim bits;
the first current source is configured to select a value of the offset voltage correction current based upon the set of trim bits; and
the second current source is configured to select a value of the VCM correction current based upon the set of trim bits.

17. The apparatus of claim 15, wherein the VCM correction current is less than the offset voltage correction current when the input voltage is in the mid voltage input range.

18. The apparatus of claim 15, wherein:
the first replica circuit includes an NMOS pair of transistors and a PMOS pair of transistors connected in parallel; and the second replica circuit includes an NMOS pair of transistors and a PMOS pair of transistors connected in series.

19. The apparatus of claim 18, wherein the first replica circuit and the second replica circuit are to provide a same output signal when the input voltage is in the mid voltage input range.

20. The apparatus of claim 15, wherein the first current source and the second current source are implemented in a different manner with respect to one another.

\* \* \* \* \*